United States Patent [19]
Beffa et al.

[11] Patent Number: 5,898,629
[45] Date of Patent: Apr. 27, 1999

[54] SYSTEM FOR STRESSING A MEMORY INTEGRATED CIRCUIT DIE

[75] Inventors: Ray Beffa; Leland R. Nevill, both of Boise; Warren M. Farnworth, Nampa; Eugene H. Cloud; William K. Waller, both of Boise, all of Id.

[73] Assignee: Micron Technology, Inc., Boise, Id.

[21] Appl. No.: 08/915,757

[22] Filed: Aug. 21, 1997

Related U.S. Application Data

[62] Division of application No. 08/663,515, Jun. 13, 1996, Pat. No. 5,852,581.

[51] Int. Cl.$^6$ .................................................. G11C 7/00
[52] U.S. Cl. ............................................ 365/201; 365/149
[58] Field of Search ...................................... 365/201, 149

[56] References Cited

U.S. PATENT DOCUMENTS

5,294,776  3/1994  Furuyama ............................ 219/209
5,298,433  3/1994  Furuyama ............................ 365/201

*Primary Examiner*—David Nelms
*Assistant Examiner*—M. Tran
*Attorney, Agent, or Firm*—Schwegman, Lundberg, Woessner & Kluth, P.A.

[57] ABSTRACT

A memory self-stress mode capable of use during wafer burn-in such as for dynamic random access memory (DRAM) integrated circuits. A burn-in power supply voltage and ground voltage delivered to a common node of a plurality of memory cell storage capacitors and to an equilibrate node coupled to bit lines. An all row high test cycles word lines between a binary low logic level and a binary high logic level, thereby stressing the dielectric of the memory cell storage capacitors by imposing stress voltages of differing polarity. A half row high test cycles alternate word lines of a word line sequence thereby stressing undesired short circuit connections between adjacent word lines.

58 Claims, 3 Drawing Sheets

SYSTEM FOR STRESSING A MEMORY INTEGRATED CIRCUIT DIE

This application is a division of U.S. patent application Ser. No. 08/663,515, filed Jun. 13, 1996, now U.S. Pat. No. 5,852,581.

THE FIELD OF THE INVENTION

The present invention relates to semiconductor integrated circuits and, more particularly, to burn-in testing at a wafer level of memory integrated circuits such as dynamic random access memory (DRAM) arrays.

BACKGROUND OF THE INVENTION

Semiconductor wafers typically comprise a plurality of substantially isolated "die" or "chips" containing circuitry, separated from each other by scribe line areas. The individual die contained within the wafer are separated by sawing and packaged individually or in multi-chip modules. One common type of integrated circuit die is a dynamic random access memory (DRAM) array.

Not all die on a particular semiconductor wafer are functional; some have manufacturing defects. Certain defects do not reveal themselves immediately after fabrication. For example, an insulating oxide layer between two conductors may be excessively thin in a particular region. Voltage and temperature stress will cause the particular region of excessively thin insulating oxide to break down, resulting in a short circuit between the two conductors which can be detected during electrical testing.

Hence, die must be tested individually to pass functional die and fail nonfunctional die. Testing a die early in the process flow reduces additional expense incurred by further processing, handling, packaging, and testing failing die. For this reason, it is particularly desirable to test integrated circuit die while they are still contained within the wafer, that is, before sawing.

Thus, stressing die prior to testing induces failures in failure-prone die prior to testing. Failing die are detected during testing and discarded. Stress-testing die early in the process flow reduces additional processing, handling, packaging, and testing costs. Burn-in stress testing is often used. By applying elevated power supply voltage levels and heating or cooling die in a chamber, failures are accelerated. Power is supplied to the die for a static burn-in. Power and additional input signals are supplied to exercise the die for a dynamic burn-in. A wafer-level DRAM burn-in technique is desired which induces failure in failure-prone die more fully or quickly.

SUMMARY OF THE INVENTION

The present invention provides a method and apparatus for stress testing a memory integrated circuit die. A burn-in power supply voltage and a ground voltage are supplied to each memory die of a plurality of memory die on a semiconductor wafer. This burn-in power supply voltage is provided to a cell plate common node of a memory cell storage capacitor. A ground voltage is provided to at least one bit line of a plurality of bit lines. At least one cell access transistor is turned on, thereby allowing conduction between the bit line and a storage node of the memory cell storage capacitor.

A ground voltage is also provided to the common cell plate of the storage capacitor and the burn-in power supply voltage is provided to at least one bit line of the plurality of bit lines. Thus, a burn-in self-stress mode creates stress conditions of differing polarities capable of being coupled across the memory cell storage capacitor dielectric and the cell access transistor. The burn-in self-stress mode also creates stress conditions of differing polarities between at least one bit line of the plurality of bit lines and at least one word line of a plurality of word lines. The burn-in self-stress mode is capable of being conducted during a wafer level burn-in of at least one wafer in a chamber or using equivalent means of heating or cooling the wafer.

In one embodiment, detection of a burn-in power supply voltage at a dedicated pad initiates a burn-in self-stress mode in response. The stress conditions of the burn-in self-stress mode are capable of use in conjunction with an all row high test and a half row high test. In one embodiment, the all row high test places a group of word lines in a binary logic high state, thereby coupling the burn-in self stress conditions of different polarities across memory cell storage capacitor dielectrics. In another embodiment, the all row high test cycles a group of word lines between a binary logic low and a binary logic high, thereby coupling the burn-in self stress conditions of different polarities across memory cell storage capacitor dielectrics. In one embodiment, the half row high test places alternating word lines in a word line sequence at a binary logic high, thereby stressing undesired short circuit conductive paths between adjacent word lines and between storage nodes of adjacent memory cell storage capacitors. In another embodiment, the half row high test cycles alternating word lines in a word line sequence between a binary logic low and a binary logic high, thereby stressing undesired short circuit conductive paths between adjacent word lines and between storage nodes of adjacent memory cell storage capacitors. In one embodiment, the binary logic high voltage is the burn-in power supply voltage.

Thus, the present invention describes a tester method and apparatus capable of stress testing memory die at a wafer level high or low temperature burn-in

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims. In the figures, elements having the same number perform essentially the same functions.

The present invention discloses a dynamic random access memory (DRAM) burn-in technique implemented at the wafer level which stresses each DRAM die of a plurality of such die on a semiconductor wafer, thereby more fully inducing failures in failure-prone die.

Figure 1:
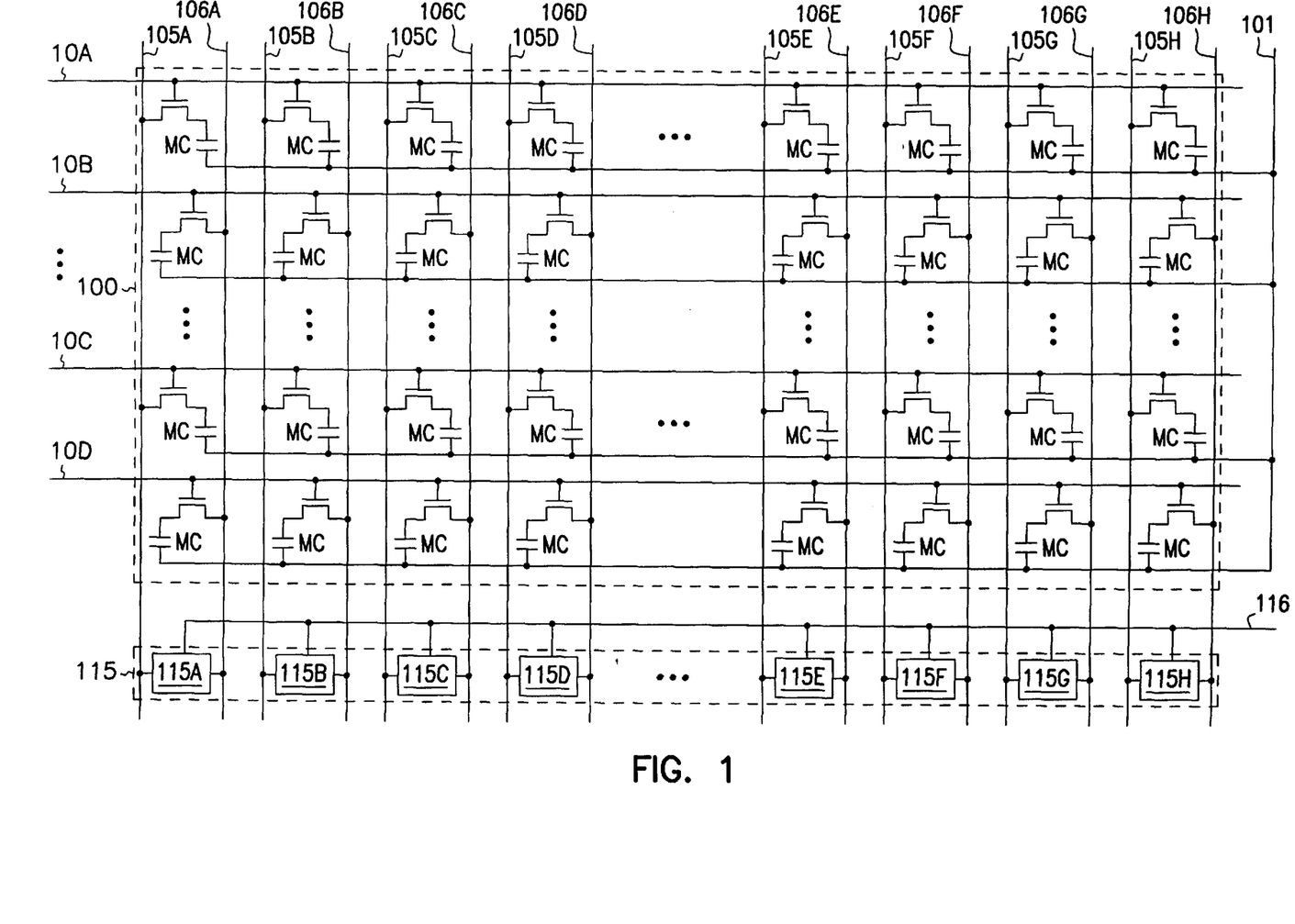
FIG. 1 is a generalized schematic illustration of a portion of a dynamic random access memory.

FIG. 1 illustrates generally one embodiment of a portion of a DRAM array. A memory cell array 100 is illustrated generally, comprising individual memory cells each designated as MC. Each memory cell is comprised of a memory cell storage capacitor and a cell access field effect transistor (FET). Each memory cell storage capacitor has both a first and second storage capacitor terminal. The first storage capacitor terminal is a cell plate common node 101 which is electrically coupled to the first storage capacitor terminal of other memory cell storage capacitors in the memory cell array 100. The fist storage capacitor terminal is provided a common supply voltage at common made 101. A second storage capacitor terminal of each memory cell storage capacitor is referred to as the storage node. Each second storage capacitor terminal is individually coupled to a cell access FET within an individual memory cell.

In FIG. 1, gate terminals of the cell access FETs are each coupled to one of word lines 110A–D, generally designated 110. Word lines 110 are controlled by a row decoder that activates a particular word line determined by a row address in normal DRAM operation. Each memory cell storage capacitor stores binary data as a quantity of charge. The cell access FETs each act as a switch transferring charge between each memory cell storage capacitor and its respective bit line 105, 106. Each memory cell is coupled to either a true bit line 105A–H or a complementary bit line 106A–H. The true and complementary bit lines are referred to generally as bit lines 105, 106.

In FIG. 1, each cell access FET acts as a switch having two states. The particular state of each cell access FET is determined by a control voltage at a gate terminal of the cell access FET. In one state, the cell access FET electrically couples the storage node of the memory cell storage capacitor to a bit line 105, 106. In the other state, the cell access FET electrically isolates the storage node of the memory cell storage capacitor from the bit line 105, 106. In FIG. 1, dotted lines indicate generally other instantiations of memory cells and bit lines which are not illustrated in FIG. 1 for clarity.

In FIG. 1, each one of equilibration circuits 115A–H generally designated 115, equilibrates one of true bit lines 105 and one of complementary bit lines 106 to an equilibrate voltage at equilibrate node 116. In normal operation, a power supply voltage (VCC) and ground voltage (ground) are supplied to the DRAM integrated circuit. In normal DRAM operation, on-chip power supply circuitry provides common node 101 with approximately the median voltage between VCC and ground. In normal DRAM operation, other on-chip power supply circuitry provides an equilibrate voltage at equilibrate node 116 with approximately the median voltage between VCC and ground.

In normal DRAM operation, a binary logic high is stored on a particular memory cell by providing the power supply voltage VCC to a particular bit line 105, 106 and providing a control voltage to a word line 110 corresponding to a gate terminal of the memory cell access FET of the particular memory cell. The memory cell access FET first couples the power supply voltage VCC on the particular bit line 105, 106 to the particular memory cell capacitor's storage node, then isolates the particular memory cell capacitor's storage node from the particular bit line 105, 106. This stores a resulting voltage of VCC/2 across the particular memory cell capacitor.

In normal operation, a binary logic low is stored on a particular memory cell by providing the ground voltage to a particular bit line 105, 106 and providing a control voltage to a word line 110 corresponding to a gate terminal of the particular memory cell access FET of the particular memory cell. The memory cell access FET first couples the ground voltage on the particular bit line 105, 106 to the particular memory cell capacitor's storage node, then isolates the particular memory cell capacitor's storage node from the particular bit line 105, 106. This stores a resulting voltage of −VCC/2 across the particular memory cell capacitor.

The present invention provides a burn-in self-stress mode of operation which differs from the normal operation of the DRAM integrated circuit. It is understood that the burn-in self-stress mode described in the present invention is capable of implementation at the wafer level, as illustrated in FIG. 2.

Figure 2:
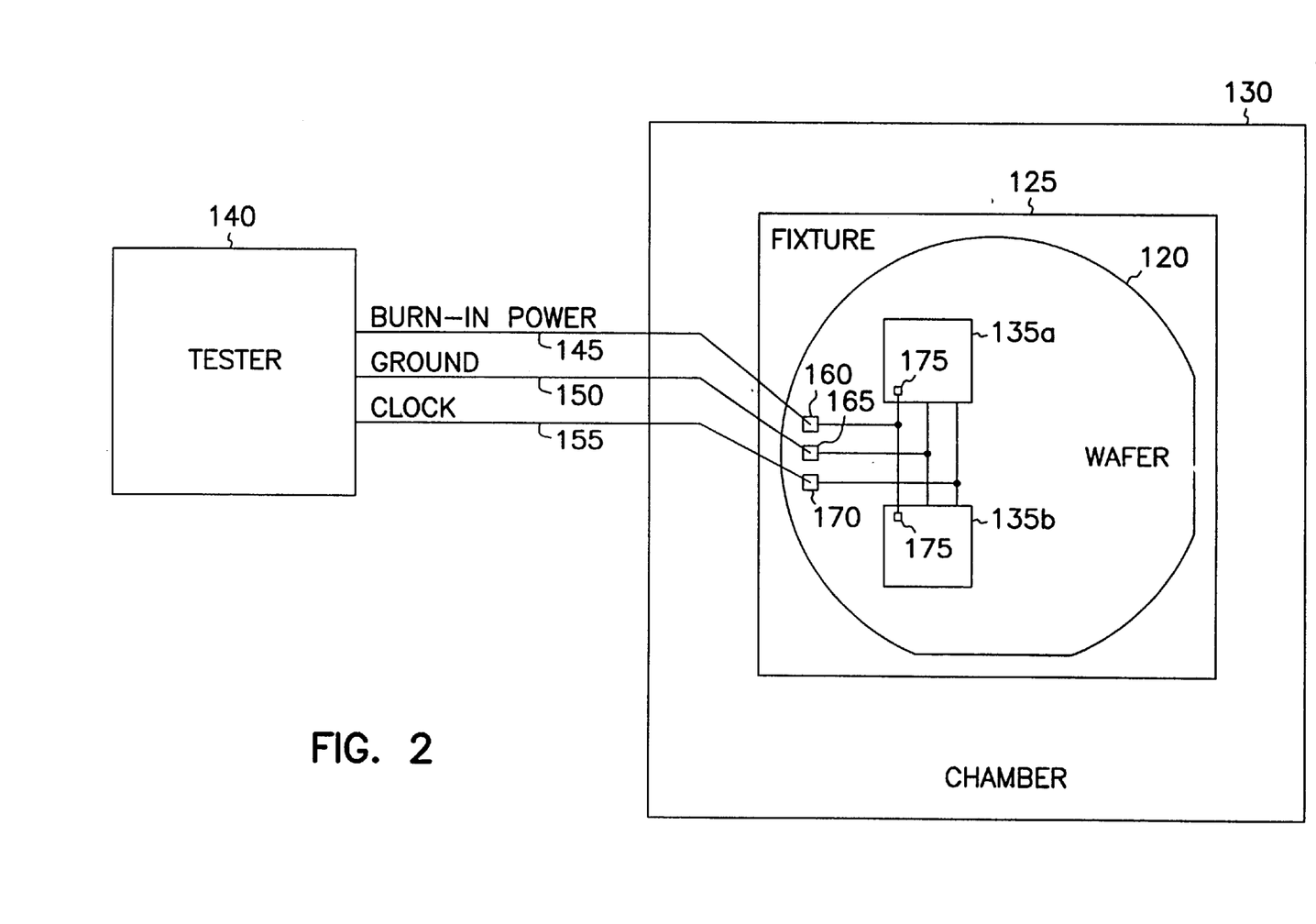
FIG. 2 is a generalized illustration of a system comprising a tester, chamber, fixture, and wafer having multiple die.

FIG. 2 illustrates generally the burn-in self-stress test apparatus. A semiconductor wafer 120 is placed in a fixture 125, which is in one embodiment contained within a chamber 130. It is understood that multiple semiconductor wafers 120 may also be tested by placement in a single or multiple fixtures 125. Each semiconductor wafer 120 comprises a plurality of die illustrated generally by 135a and 135b, referred to generally as 135. It is understood that wafer 120 comprises other die 135 which are not shown for clarity. Tester 140 supplies a burn-in power supply voltage VCC at mode 145. Tester 140 also supplies a ground voltage at node 150 and an optional external clock signal at node 155. In one embodiment, burn-in power supply mode 145, ground node 150, and option external clock signal node 155 are received at wafer 120 at wafer burn-in power supply pad 160, wafer ground pad 165, and wafer clock pad 170 respectively, each discussed in further detail below. The signals at wafer burn-in power supply pad 160, wafer ground pad 165, and wafer clock pad 170 are coupled to each die 135 by interconnection lines. In one embodiment, a dedicated die burn-in power supply pad 175 on each die including 135a–b, which is different from a power supply pad used in normal DRAM operation, is coupled to wafer burn-in power supply pad 160.

Figure 3:
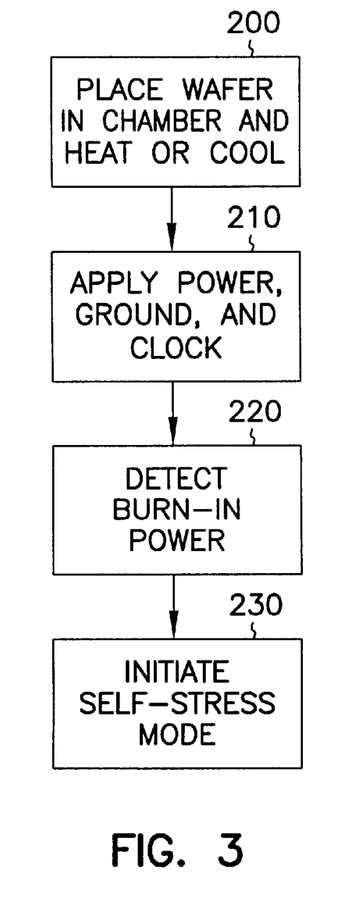
FIG. 3 is a flow diagram illustrating steps prior to initiation of burn-in self-stress mode.

FIG. 3 is a flow diagram illustrating certain preliminary steps in the burn-in testing process. At least one semiconductor wafer such as wafer 120 comprising multiple DRAM integrated circuit die 135 is loaded into fixture 125 in chamber 130 at step 200 and the chamber 130 temperature is raised to approximately 127 degrees Celsius. Burn-in power supply voltage VCC at node 145, the ground voltage at node 150, and an optional external clock signal at node 155 are each applied to each DRAM die 135 at step 210. In one embodiment, at least one of burn-in power supply voltage VCC at node 145, the ground voltage at node 150, and the optional external clock signal at node 155 are applied to external probe pads 160, 165, and 170 respectively on the semiconductor wafer 120, and coupled to each individual DRAM die 135 on the semiconductor wafer 120 by interconnection lines in scribe line areas routed between the individual DRAM die 135 during semiconductor fabrication. In another embodiment, at least one of the burn-in power supply voltage VCC at node 145, the ground voltage at node 150, and the optional external clock signal at node 155 are supplied to each DRAM die 135 on the semiconductor wafer 120 through interconnection lines deposited upon a passivation layer on the semiconductor wafer 120 for use including during burn-in of the semiconductor wafer 120. A combination of interconnection lines in the scribe line areas and interconnection lines deposited upon a passivation layer on the semiconductor wafer 120 may also be used to couple the burn-in power supply voltage VCC at node 145, the ground voltage at node 150, and the optional external clock signal at node 155 to each DRAM die 135 on the semiconductor wafer 120. In another embodiment, an external membrane or wafer containing interconnection routing of the burn-in power supply voltage VCC at node 145, the ground voltage at node 150, and the optional external clock signal at node 155 is physically and electrically contacted to the semiconductor wafer 120, thereby coupling these voltage signals to each DRAM die 135 on the semiconductor wafer 120. In another embodiment, fixture 125 containing a plurality of probe pins couples the burn-in power supply voltage VCC at node 145, the ground voltage at node 150, and the optional external clock signal at node 155 to the individual die 135 on the semiconductor wafer, or such probe pins may be used in combination with interconnection routing in the scribe line areas or on the passivation.

In another embodiment, optional external clock signal at node 155 is not applied to semiconductor wafer 120. Instead, an internal clock signal is generated by DRAM die 135 on semiconductor wafer 120. In another embodiment, an external clock signal is provided to each DRAM die 135 on semiconductor wafer 120 by superimposing a carrier signal upon the burn-in power supply voltage VCC at node 145.

In one embodiment, burn-in power supply voltage VCC at node 145 applied at step 210 is received at burn-in power supply pad 175 on each DRAM integrated circuit die 135, wherein each burn-in power supply pad 175 is distinct from a power supply pad at which a power supply voltage VCC is received during normal DRAM operation. Upon detecting at step 220 the presence of burn-in power supply voltage VCC at node 145 applied at burn-in power supply pad 175, each DRAM die 135 initiates the burn-in self-stress mode at step 230. In another embodiment, after optional external clock signal at node 155, or the carrier signal superimposed upon the burn-in power supply voltage VCC at node 145, is detected for an arbitrary number of sequential clock cycles, the DRAM die 135 initiates the burn-in self-stress mode. In another embodiment, a test key electronic switch is coupled to address pins on each DRAM die 135 such as through interconnection in the scribe line areas, upon the passivation layer, within the external membrane, or through fixture 125. The test key electronic switch comprises a set of known input voltages or timing conditions recognized by each DRAM die 135 and responded to by initiating the burn-in self-stress mode.

Figure 4:
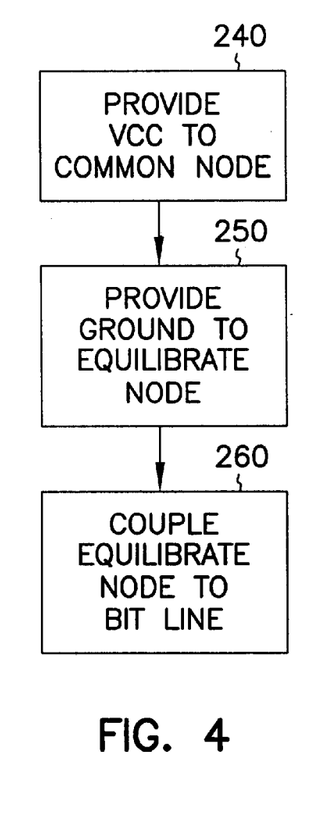
FIG. 4 is a flow diagram illustrating steps for creating a first stress condition.
Figure 5:
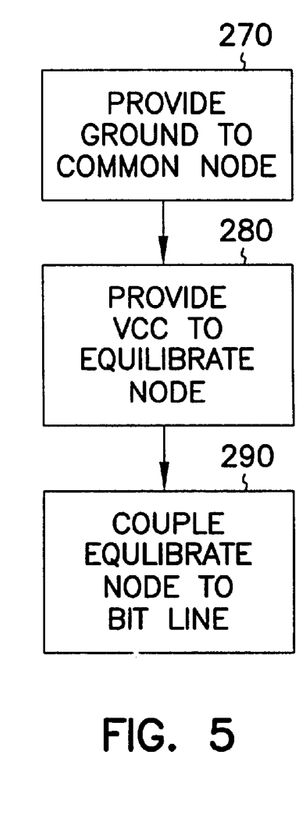
FIG. 5 is a flow diagram illustrating steps for creating a second stress condition.

FIGS. 4–5 are flow diagrams illustrating certain steps in embodiments of the burn-in self-stress mode, with reference to the portion of the DRAM array illustrated in FIG. 1. It is understood that the burn-in self-stress is conducted at the wafer level and that the description given below is capable of being applied simultaneously to each DRAM die 135 on semiconductor wafer 120; the burn-in self-stress mode is described with respect to a particular DRAM die 135 on the semiconductor wafer 120 for clarity only.

Referring to FIG. 4 and FIG. 1 jointly, establishment of a fit stress condition is described below. After initiating the burn-in self-stress mode, a normal DRAM operation common node voltage at node 101 of VCC/2 is replaced by a voltage approximately equal to the burn-in power supply voltage VCC at node 145 at step 240 during the first stress condition. Similarly, the normal DRAM operation equilibrate voltage of VCC/2 at equilibrate node 116 is replaced by a voltage at approximately the ground node voltage potential at step 250 during the first stress condition. The equilibrate node 116 voltage is coupled at least one bit line 105, 106 by at least one equilibrate circuit 115 at step 260. The first stress condition voltages are generated either by reprogramming the respective on-chip power supply circuitry coupled to the common node 102 and equilibrate node 116, or by bypassing the corresponding on-chip common node 101 and equilibrate node 116 respective power supply circuitry during the first stress condition.

Referring to FIG. 5 and FIG. 1 jointly, a second stress condition is also established, as described below. After initiating the burn-in self-stress mode, the normal DRAM operation common node voltage at mode 101 of VCC/2 is replaced by a voltage approximately equal to the ground voltage at step 270 during the second stress condition. Similarly, the normal DRAM operation equilibrate voltage of VCC/2 at equilibrate mode 116 is replaced by a voltage approximately equal to the burn-in power supply voltage VCC at node 145 at step 280 during the second stress condition. The equilibrate node 116 voltage is coupled at least one bit line 105, 106 by at least one equilibrate circuit 115 at step 290. The second stress condition voltages are generated either by reprogramming the respective on-chip power supply circuitry coupled to the common node 101 and equilibrate node 116, or by bypassing the respective on-chip power supply circuitry during the first stress condition.

During the burn-in self-stress mode, the applied burn-in power supply voltage VCC at node 145 may exceed the normal power supply voltage VCC delivered during normal DRAM operation. In one embodiment, a DRAM die 135 designed to operate at a normal power supply voltage VCC of approximately 3 volts receives an elevated burn-in power supply voltage VCC at node 145 of approximately 6 volts during the burn-in self-stress mode. DC voltage stress dependent failures are accelerated by the elevated burn-in power supply voltage VCC at node 145.

Referring again to FIG. 1, application of the first and second stress conditions is described. In one embodiment, an all row high test is used in conjunction with at least one of the first and second stress conditions. During an all row high test, all word lines 110 are placed at the burn-in power supply voltage VCC at node 145. In an alternate embodiment of the all row high test, all word lines 110 are cycled as a group between the ground voltage at node 150 and the burn-in power supply voltage VCC at node 145. When a word line 10 is high, a memory cell access transistor comprising an n-channel metal-oxide-semiconductor (NMOS) field-effect transistor (FET) is on, thereby coupling a bit line 105, 106 to a storage node of a memory cell storage capacitor.

Referring to FIG. 1, for the all row high test used in conjunction with the stress condition of FIG. 4, a bit line 105, 106 couples the ground voltage at node 150 to the storage node of the memory cell storage capacitor. Burn-in power supply voltage VCC at node 145 is coupled to the common node 101. Thus, a voltage drop of approximately 6 volts between the common node 101 and the storage node stresses the capacitor dielectric of the memory cell storage capacitor. A voltage drop of approximately 6 volts is provided between each of the word lines 110 at burn-in power supply voltage VCC at node 145 (approximately 6 volts) and each of the bit lines 105, 106 at the equilibrate voltage (approximately 0 volts) provided at equilibrate node 116. Any undesired thin conductive short circuiting connections between the word lines 110 and the bit lines 105, 106 are stressed by this resulting dc voltage.

Referring to FIG. 1, for the all row high test used in conjunction with the second stress condition described in FIG. 5, a high binary logic voltage applied to each word line 110 allows the bit line 105, 106 to couple approximately burn-in power supply voltage VCC at node 145 to the storage node of the memory cell storage capacitor. Ground voltage at node 150 is provided to the common node 101. Thus, a voltage drop of approximately −6 volts between the common node 101 and the storage node stresses the capacitor dielectric of the memory cell storage capacitor. The capacitor dielectric is stressed by a dc voltage of different polarity than applied during the first stress condition. When each word line 110 is returned to approximately the ground voltage at node 150, a voltage drop of approximately −6 volts is created between each of the word lines 110 at the ground voltage at node 150 (approximately 0 volts) and each of the bit lines 105, 106, which are each at the equilibrate voltage (approximately 6 volts) provided at equilibrate node 116. Any undesired thin conductive short circuiting connections between the word lines 110 and the bit lines 105, 106 are stressed by a dc voltage of different polarity than applied during the first stress condition.

In one embodiment, a half row high test is used in conjunction with at least one of the first and second stress conditions. In one embodiment of a half row high test, alternate word lines 110 are placed at the burn-in power supply voltage VCC at node 145. In another embodiment of a half row high test, alternate word lines 110 are cycled as a group between the ground voltage at node 150 and the burn-in power supply voltage VCC at node 145. As illustrated generally in FIG. 1, word lines 110 are arranged in a sequence 110A–D, with intermediate word lines 110 in the sequence omitted for clarity. During the half row high test, a first group of word lines 110 comprising every other word line 110 of the sequence of word lines 110 is turned on by providing first group of word lines 110 with the burn-in power supply voltage VCC at node 145. A second group of word lines 110 comprise the remaining word lines 110 not included in the first group of word lines 110. The second group of word lines 110 is turned off by providing the second group of word lines 110 with the ground voltage at node 150. The voltages applied to the first and second group of word lines are then optionally interchanged. The half-row high test in conjunction with each of the first and second stress conditions, FIGS. 4, 5 respectively, is capable of providing the dc voltage stresses already described with respect to the all row high test. The half-row high test also provides a dc voltage stress between adjacent word lines 110 and equal to the burn-in power supply voltage VCC (approximately 6V) at node 145. Any undesired thin conductive short circuiting connections between the adjacent word lines 110, such as residual polysilicon, will thereby also be stressed by a do voltage. By optionally interchanging the voltages applied to the first and second group of word lines, the polarity of the dc voltage stress between adjacent word lines 110 is reversed. Thus, voltage stress polarity dependent failures between adjacent word lines 110 are induced by this optional interchanging of the voltage applied to the first and second group of word lines.

Since induced failures may result in a short circuit between the burn-in power supply voltage VCC at node 145 and the ground voltage at node 150, failing die may begin to draw a high current from the burn-in power supply voltage VCC at node 145. Moreover, multiple die 135 on the semiconductor wafer may fail in this manner, further increasing the current drawn from the burn-in power supply voltage VCC at node 145. In one embodiment, failing die are prevented from reducing the magnitude of a burn-in power supply voltage VCC at node 145 provided by a tester 140 burn-in power supply having finite output resistance. Each die 135 on the semiconductor wafer optionally includes a fusible link or equivalent detection and isolation circuitry, to detect a high current condition and isolate the failing die from the burn-in power supply VCC at node 145.

Thus, the present invention discloses a dynamic random access memory (DRAM) burn-in technique implemented at the wafer level which stresses each DRAM die 135 on a semiconductor wafer 120, thereby inducing failures in failure-prone die more fully or quickly. Though burn-in self-stress mode has been described with respect to a particular DRAM die 135, it is understood that the present invention is applicable to burn-in self-stress of a plurality of die 135, contained within a semiconductor wafer 120. It is also understood that the first and second stress conditions, and the all row and half row high tests may be used statically or dynamically or in combination with each other in a number of different permutations without departing from the scope and spirit of the present invention. In addition, the order of performance of the steps described with respect to the first and second stress conditions and the all row and half row high tests may be interchanged without departing from the scope and spirit of the present invention.

Although specific embodiments have been illustrated and described herein for purposes of description of the preferred embodiment it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A system for stress testing a memory integrated circuit die, the system comprising:

burn-in power supply voltage connection capable of coupling a burn-in power supply voltage to a cell plate common node of a memory cell storage capacitor of each memory die of a plurality of memory die on a semiconductor wafer; and ground voltage connection capable of coupling a ground voltage to at least one bit line of a plurality of bit lines of each memory die of the plurality of memory die on the semiconductor wafer and also capable of coupling the bit line to a storage node of the memory cell storage capacitor.

2. The system of claim 1, further comprising:

ground voltage connection capable of coupling a ground voltage to the common cell plate of the memory cell storage capacitor; and burn-in power supply voltage connection capable of coupling a burn-in power supply voltage to at least one bit line of the plurality of bit lines.

3. The system of claim 2, wherein a particular word line of a plurality of word lines is turned on to couple the bit line to the storage node of the memory cell storage capacitor.

4. The system of claim 3, wherein the plurality of word lines are arranged in a word line sequence and wherein the turning on of the particular word line comprises turning on each word line in the word line sequence.

5. The system of claim 1, further comprising a clock signal connection coupled to each memory die of the plurality of memory die on the semiconductor wafer.

6. The system of claim 1, further comprising an chamber capable of heating the semiconductor wafer.

7. The system of claim 1, wherein the memory integrated circuit die comprises a dynamic random access memory (DRAM).

8. A system for stress testing a memory integrated circuit die, the system comprising:

burn-in power supply voltage connection capable of coupling a burn-in power supply voltage to a cell plate common node of a memory cell storage capacitor of each memory die of a plurality of memory die on a semiconductor wafer;

ground voltage connection capable of coupling a ground voltage to at least one bit line of a plurality of bit lines of each memory die of the plurality of memory die on the semiconductor wafer and also capable of coupling the bit line to a storage node of the memory cell storage capacitor;

ground voltage connection capable of coupling a ground voltage to the common cell plate of the memory cell storage capacitor;

burn-in power supply voltage connection capable of coupling a burn-in power supply voltage to at least one bit line of the plurality of bit lines;

wherein a particular word line of a plurality of word lines is turned on to couple the bit line to the storage node of the memory cell storage capacitor; and wherein the plurality of word lines are arranged in a word line sequence and wherein the turning on of the particular word line comprises turning on alternating word lines in the word line sequence.

9. The system of claim 8, further comprising a clock signal connection connected to the memory integrated circuit die.

10. The system of claim 8, further comprising a chamber capable of heating the memory integrated circuit die.

11. The system of claim 8, further comprising a chamber capable of cooling the memory integrated circuit die.

12. The system of claim 8, wherein the memory integrated circuit die comprises a dynamic random access memory (DRAM).

13. A system for stress testing a memory integrated circuit die, the system comprising:

burn-in power supply voltage connection capable of coupling a burn-in power supply voltage to a cell plate common node of a memory cell storage capacitor of each memory die of a plurality of memory die on a semiconductor wafer;

ground voltage connection capable of coupling a ground voltage to at least one bit line of a plurality of bit lines of each memory die of the plurality of memory die on the semiconductor wafer and also capable of coupling the bit line to a storage node of the memory cell storage capacitor;

ground voltage connection capable of coupling a ground voltage to the common cell plate of the memory cell storage capacitor;

burn-in power supply voltage connection capable of coupling a burn-in power supply voltage to at least one bit line of the plurality of bit lines;

wherein a particular word line of a plurality of word lines is turned on to couple the bit line to the storage node of the memory cell storage capacitor; and a chamber capable of cooling the memory integrated circuit die.

14. A system for stress testing a memory integrated circuit die including a plurality of memory cells, a plurality of bit line, a sequence of word lines, and a common node, with each memory cell coupled to one of the bit lines, one of the word lines, and the common node, the system comprising:

means for providing a burn-in voltage differential across the common node and one of the bit lines; and means for turning on alternate word lines of the sequence of word lines.

15. The system of claim 14, further comprising:

means for reversing polarity of the burn-in voltage differential one or more times.

16. The system of claim 14, wherein the means for providing the burn-in voltage differential across the common node and one of the bit lines comprises:

a burn-in power supply voltage connection to the common node; and a ground voltage connection to one of the bit lines.

17. The system of claim 14, wherein the means for providing the differential burn-in voltage comprises a conductor on a passivation layer of the memory integrated circuit die, the conductor connected to the common node or to the one bit line.

18. The system of claim 14, wherein the means for providing the differential burn-in voltage includes a burn-in power supply node on the integrated circuit memory die, which is not used during normal operation of the die.

19. The system of claim 14, wherein the means for providing the differential burn-in voltage superimposes a clock signal on the differential burn-in voltage.

20. A system of stressing insulation in a memory integrated circuit die on a wafer, the memory integrated circuit die including a plurality of memory cells, a plurality of bit lines, a sequence of word lines, and a common node, with each memory cell coupled to one of the bit lines, to one of the word lines, and to the common node, the system comprising:

means for providing a differential burn-in voltage across a pair of adjacent word lines in the word line sequence to stress insulation between the adjacent word lines; and means for reversing polarity of the differential burn-in voltage one or more times to further stress insulation between the adjacent word lines.

21. The system of claim 20, further comprising:

means for isolating the integrated circuit memory die from the differential burn-in voltage, after the insulation between the pair of adjacent word lines fails.

22. The system of claim 20, wherein the means for providing the differential burn-in voltage also provides the burn-in voltage differential across the common node and the storage node of one of the memory cells to stress insulation between the common node and the storage node or across one bit line and one word line to stress insulation between the one bit line and the one word line.

23. The system of claim 20, further comprising:

means for isolating the integrated circuit memory die from the differential burn-in voltage after insulation between the common node and the storage node fails, or after insulation between the one bit line and the one word line fails.

24. The system of claim 23, wherein the means for isolating includes a fusible link.

25. The system of claim 20, wherein the means for providing the differential burn-in voltage comprises:

a conductor on a passivation layer of the memory integrated circuit die, the conductor coupled to the common node or to the one bit line.

26. The system of claim 20, wherein the means for providing the differential burn-in voltage includes a burn-in power supply node on the integrated circuit memory die, which is not used during normal operation of the die.

27. The system of claim 20, wherein the means for providing the differential burn-in voltage superimposes a clock signal on the differential burn-in voltage.

28. A system for stressing insulation in a memory integrated circuit die on a wafer, the memory integrated circuit die including a plurality of memory cells, a plurality of bit lines, a sequence of word lines, and a common node, with each memory cell coupled to one of the bit lines, one of the word lines, and the common node, the system comprising:

means for providing a burn-in voltage differential across a pair of adjacent word lines in the word line sequence, across the common node and the storage node of one of the memory cells, or across one bit line and one word line; and means for reversing polarity of the burn-in voltage differential one or more times.

29. The system of claim 28, wherein the means for providing the burn-in voltage differential comprises:

means for providing a burn-in power supply voltage; and means for providing a ground voltage.

30. The system of claim 28, wherein the means for providing the burn-in voltage differential comprises:

a conductor on a passivation layer of the memory integrated circuit die, the conductor connected to the common node or to the one bit line.

31. The system of claim 28, wherein the means for providing the burn-in voltage differential comprises:

a burn-in power supply node on the integrated circuit memory die, which is not used during normal operation of the die.

32. The system of claim 28, wherein the means for providing the burn-in voltage differential superimposes a clock signal on the burn-in voltage differential.

33. A system for stress testing a memory integrated circuit die comprising:

burn-in power supply voltage connection connecting a burn-in power supply voltage to a cell plate common node of a memory cell storage capacitor of the memory integrated circuit die; and ground voltage connection connecting a ground voltage to at least one bit line of a plurality of bit lines of the memory integrated circuit die and also connecting the bit line to a storage node of the memory cell storage capacitor.

34. The system of claim 33, further comprising:

ground voltage connection connecting a ground voltage to the common cell plate of the memory cell storage capacitor; and burn-in power supply voltage connection connecting a burn-in power supply voltage to at least one bit line of the plurality of bit lines.

35. The system of claim 34, wherein a particular word line of a plurality of word lines is turned on to couple the bit line to the storage node of the memory cell storage capacitor.

36. The system of claim 35, wherein the plurality of word lines are arranged in a word line sequence and wherein the turning on of the particular word line comprises turning on each word line in the word line sequence.

37. The system of claim 33, further comprising a clock signal connection coupled to the memory integrated circuit die.

38. The system of claim 33, further comprising an chamber capable of heating the memory integrated circuit die.

39. The system of claim 33, wherein the memory integrated circuit die comprises a dynamic random access memory (DRAM).

40. A system for stress testing a memory integrated circuit die comprising:

a first voltage source providing a burn-in voltage differential across the common node and one of the bit lines; and a second voltage source for turning on alternate word lines of the sequence of word lines.

41. The system of claim 40, wherein polarity of the burn-in voltage differential is reversed one or more times.

42. The system of claim 40, wherein the first voltage source providing the burn-in voltage differential across the common node and one of the bit lines comprises:

a burn-in power supply voltage connection to the common node; and a ground voltage connection to one of the bit lines.

43. The system of claim 40, wherein the first voltage source providing the differential burn-in voltage comprises a conductor on a passivation layer of the memory integrated circuit die, the conductor connected to the common node or to the one bit line.

44. The system of claim 40, wherein the first voltage source providing the differential burn-in voltage includes a burn-in power supply node on the integrated circuit memory die, which is not used during normal operation of the die.

45. The system of claim 40, wherein the first voltage source for providing the differential burn-in voltage superimposes a clock signal on the differential burn-in voltage.

46. A system of stressing insulation in a memory integrated circuit die comprising:

a voltage source providing a differential burn-in voltage across a pair of adjacent word lines in the word line sequence to stress insulation between the adjacent word lines; and wherein polarity of the differential burn-in voltage is reversed one or more times to further stress insulation between the adjacent word lines.

47. The system of claim 46, wherein an integrated circuit memory die is isolated from the differential burn-in voltage, after the insulation between the pair of adjacent word lines fails.

48. The system of claim 46, wherein the voltage source providing the differential burn-in voltage also provides the burn-in voltage differential across the common node and the storage node of one of the memory cells to stress insulation between the common node and the storage node or across one bit line and one word line to stress insulation between the one bit line and the one word line.

49. The system of claim 46, further comprising:

wherein an integrated circuit memory die is isolated from the differential burn-in voltage after insulation between the common node and the storage node fails, or after insulation between the one bit line and the one word line fails.

50. The system of claim 49, wherein an memory integrated circuit memory die is isolated using a fusible link.

51. The system of claim 46, wherein the voltage source providing the differential burn-in voltage comprises:

a conductor on a passivation layer of the memory integrated circuit die, the conductor coupled to the common node or to the one bit line.

52. The system of claim 46, wherein the voltage source providing the differential burn-in voltage includes a burn-in power supply node on the memory integrated circuit die, which is not used during normal operation of the die.

53. The system of claim 46, wherein the voltage source providing the differential burn-in voltage superimposes a clock signal on the differential burn-in voltage.

54. A system for stressing insulation in a memory integrated circuit die comprising:
- a voltage source providing a burn-in voltage differential across a pair of adjacent word lines in the word line sequence, across the common node and the storage node of one of the memory cells, or across one bit line and one word line; and
- wherein polarity of the burn-in voltage differential is reversed one or more times.

55. The system of claim 54, wherein the voltage source providing the burn-in voltage differential comprises:
- a burn-in power supply voltage; and
- a ground voltage.

56. The system of claim 54, wherein the voltage source providing the differential burn-in voltage comprises:
- a conductor on a passivation layer of the memory integrated circuit die, the conductor connected to the common node or to the one bit line.

57. The system of claim 54, wherein the voltage source providing the differential burn-in voltage comprises:
- a burn-in power supply node on the memory integrated circuit die, which is not used during normal operation of the die.

58. The system of claim 54, wherein the voltage source providing the differential burn-in voltage superimposes a clock signal on the differential burn-in voltage.

* * * * *

UNITED STATES PATENT AND TRADEMARK OFFICE
CERTIFICATE OF CORRECTION

PATENT NO. :  5,898,629
DATED       :  Apr. 27, 1999
INVENTOR(S) :  Ray Beffa, et al.

It is certified that error appears in the above-identified patent and that said Letters Patent is hereby corrected as shown below:

At Col. 12, line 1, please delete "an" and insert --a--.

At Col. 12, line 59, please delete "an" and insert --a--.

At Col. 9, line 1, please delete "an" and insert --a--.

Signed and Sealed this

Thirtieth Day of November, 1999

Attest:

Q. TODD DICKINSON

*Attesting Officer*    *Acting Commissioner of Patents and Trademarks*